(12) United States Patent
Ishikawa et al.

(10) Patent No.: US 8,193,531 B2
(45) Date of Patent: Jun. 5, 2012

(54) SEMICONDUCTOR DEVICE AND MANUFACTURING METHOD THEREOF

(75) Inventors: Akira Ishikawa, Atsugi (JP); Yoshiharu Hirakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 262 days.

(21) Appl. No.: 12/071,976

(22) Filed: Feb. 28, 2008

(65) Prior Publication Data

US 2008/0157089 A1 Jul. 3, 2008

Related U.S. Application Data

(63) Continuation of application No. 10/742,955, filed on Dec. 23, 2003, now Pat. No. 7,439,087.

(30) Foreign Application Priority Data

Dec. 27, 2002 (JP) ................................. 2002-378892

(51) Int. Cl.
*H01L 29/04* (2006.01)
(52) U.S. Cl. .............. 257/59; 257/72; 349/99; 349/121; 349/141; 349/155; 349/156
(58) Field of Classification Search .................... 257/59, 257/72; 349/99, 121, 141, 155, 156
See application file for complete search history.

(56) References Cited

U.S. PATENT DOCUMENTS

| 5,608,232 | A | 3/1997 | Yamazaki et al. |
| 5,756,372 | A * | 5/1998 | Wakui et al. ................ 438/30 |
| 5,933,204 | A | 8/1999 | Fukumoto |
| 6,140,165 | A | 10/2000 | Zhang et al. |
| 6,411,349 | B2 | 6/2002 | Nakazawa et al. |
| 6,512,566 | B1 | 1/2003 | Yamagishi et al. |
| 6,524,895 | B2 | 2/2003 | Yamazaki et al. |
| 6,724,452 | B1 * | 4/2004 | Takeda et al. ................. 349/139 |
| 6,809,790 | B2 | 10/2004 | Yamagishi et al. |
| 6,927,829 | B2 | 8/2005 | Yamagishi et al. |
| 7,084,503 | B2 | 8/2006 | Ishikawa et al. |

(Continued)

FOREIGN PATENT DOCUMENTS

EP 0 751 417 1/1997

(Continued)

*Primary Examiner* — Anthony Ho
(74) *Attorney, Agent, or Firm* — Eric J. Robinson; Robinson Intellectual Property Law Office, P.C.

(57) ABSTRACT

A technology for reducing distance between adjacent pixel electrodes to smaller than the limit set by conventional process margin and also preventing adjacent pixel electrodes from being short circuited is provided.

In a manufacturing method of a semiconductor device according to the invention, a first and a second TFTs 11 and 12 are formed over a substrate 10; an insulating film 13 is formed above the TFTs; a resist mask 14 for covering an area between adjacent pixel electrode formation areas is formed; the insulating film is formed by wet etching using the resist mask 14 as a mask, thereby forming a projection 13b provided with a surface having curvature or an inclined surface, which is disposed between the adjacent pixel electrode areas over the insulating film; a conductive film 15 is formed over the insulating film; and a conductive film about an upper part of the projection is polished and removed by CMP, thereby insulating the adjacent pixel electrodes by the projection as well as forming pixel electrodes 15a and 15b formed with the conductive film over the base insulating film.

28 Claims, 6 Drawing Sheets

U.S. PATENT DOCUMENTS

| | | | |
|---|---|---|---|
| 7,167,226 B2 | 1/2007 | Satake | |
| 2001/0035526 A1 * | 11/2001 | Yamazaki et al. | 257/57 |
| 2002/0113930 A1 | 8/2002 | Satake | |
| 2005/0099566 A1 | 5/2005 | Satake | |

FOREIGN PATENT DOCUMENTS

| | | |
|---|---|---|
| EP | 1 148 374 | 10/2001 |
| JP | 05-158068 | 6/1993 |
| JP | 09-073103 | 3/1997 |
| JP | 09-181323 | 7/1997 |
| JP | 10-039332 | 2/1998 |
| JP | 2873669 | 3/1999 |
| JP | 11-126038 | 5/1999 |
| JP | 2000-243975 | 9/2000 |
| JP | 3300153 | 7/2002 |
| JP | 2004-157210 | 6/2004 |

* cited by examiner

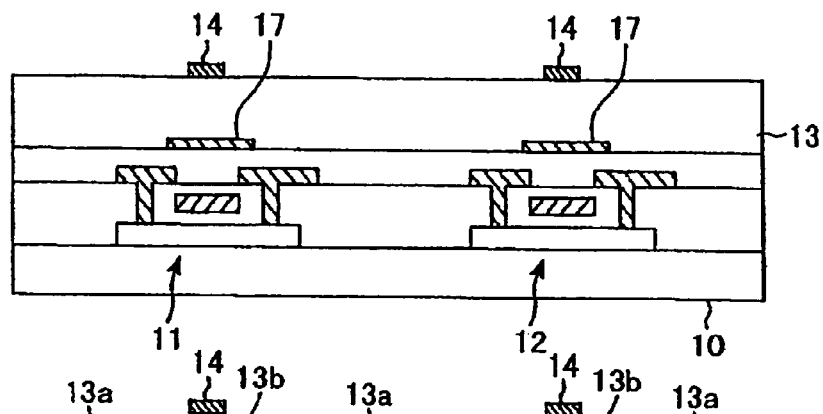
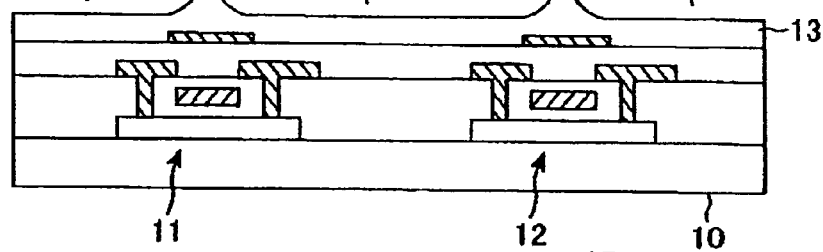
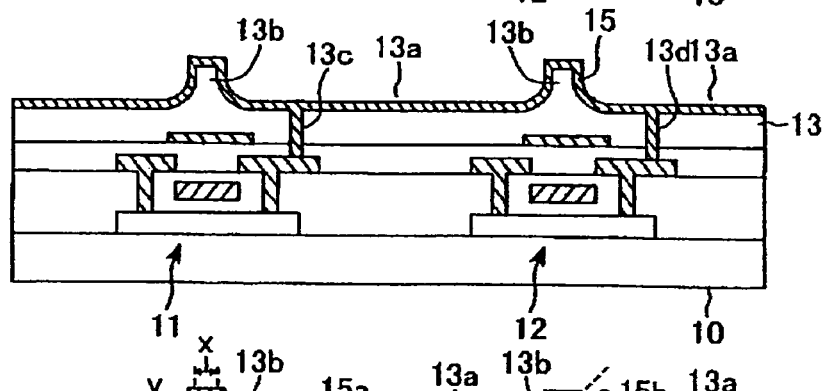
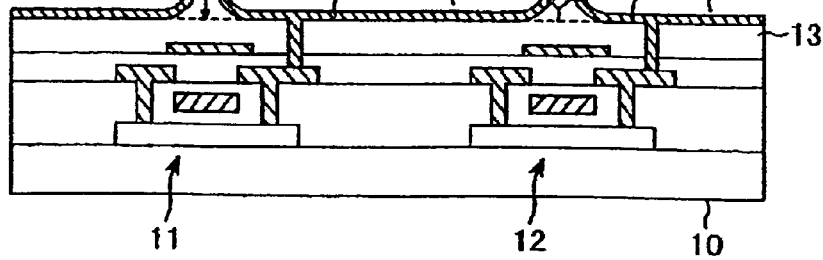

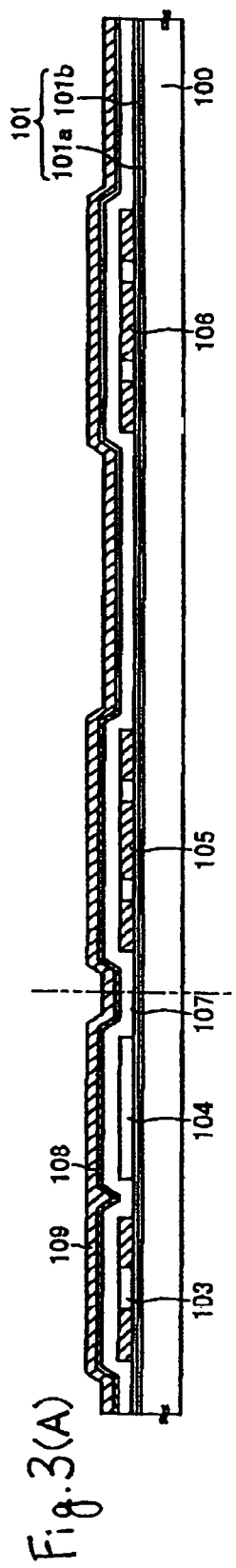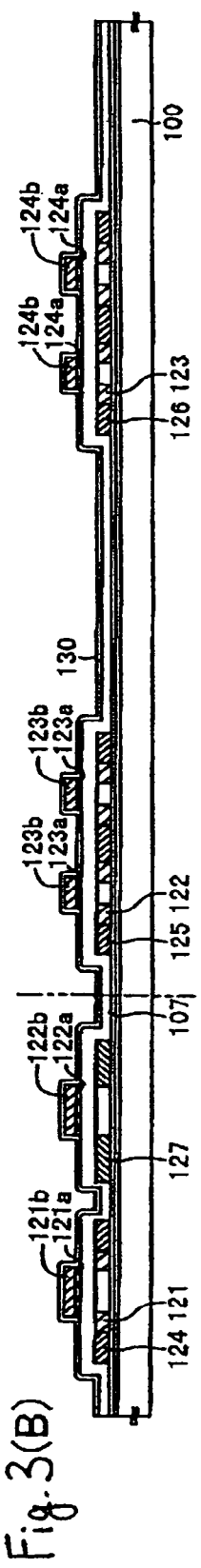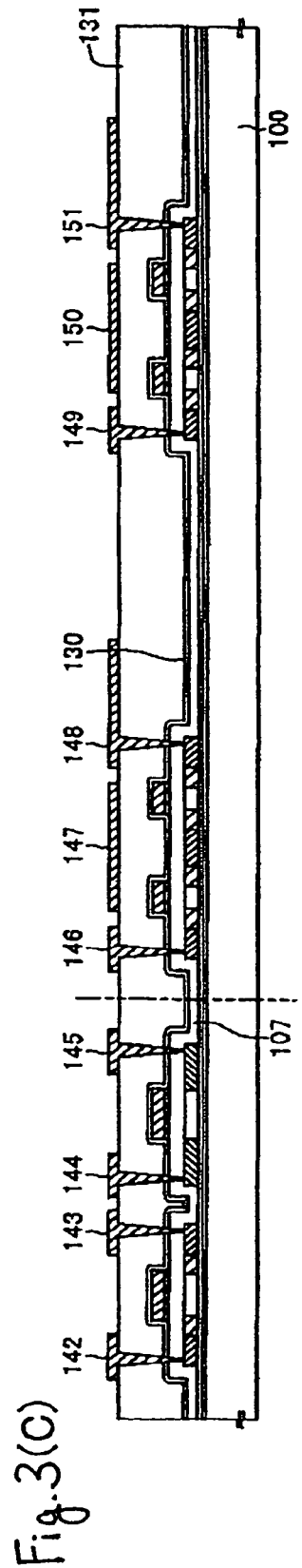

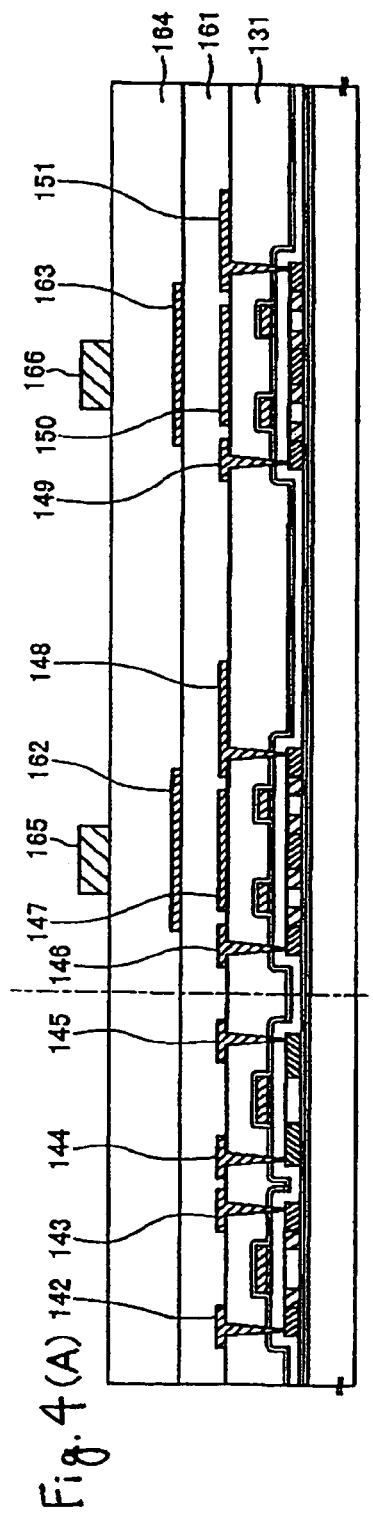
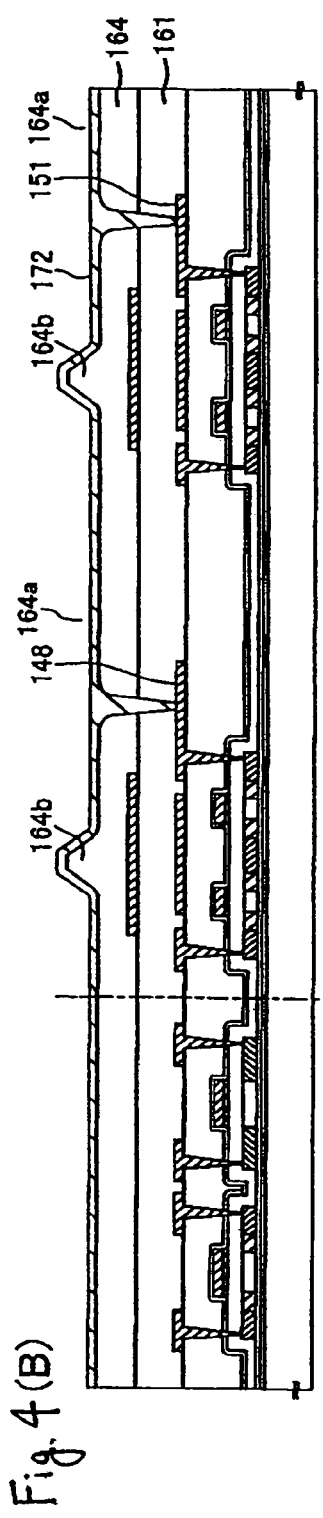
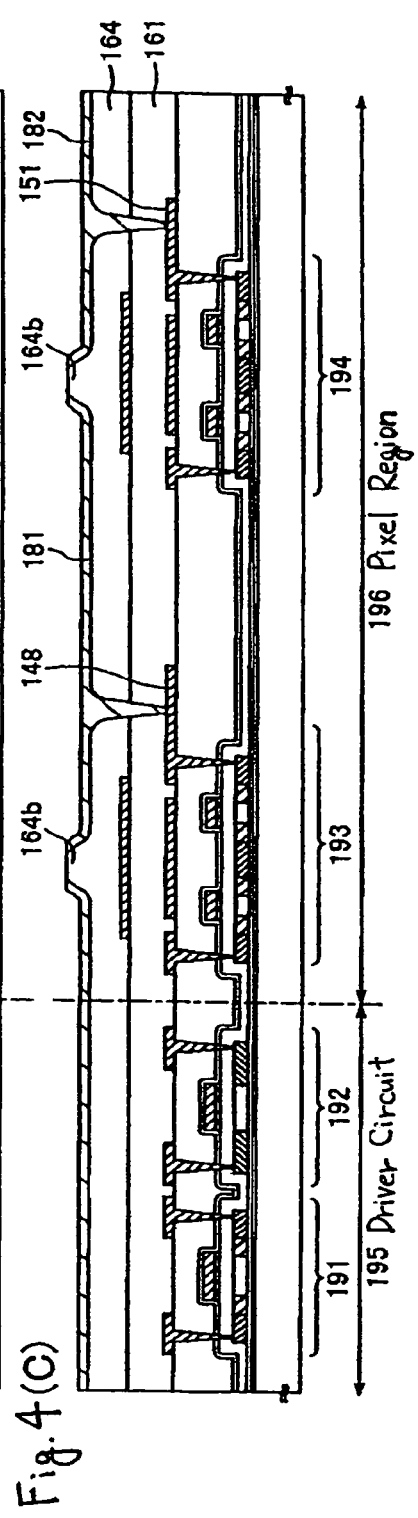

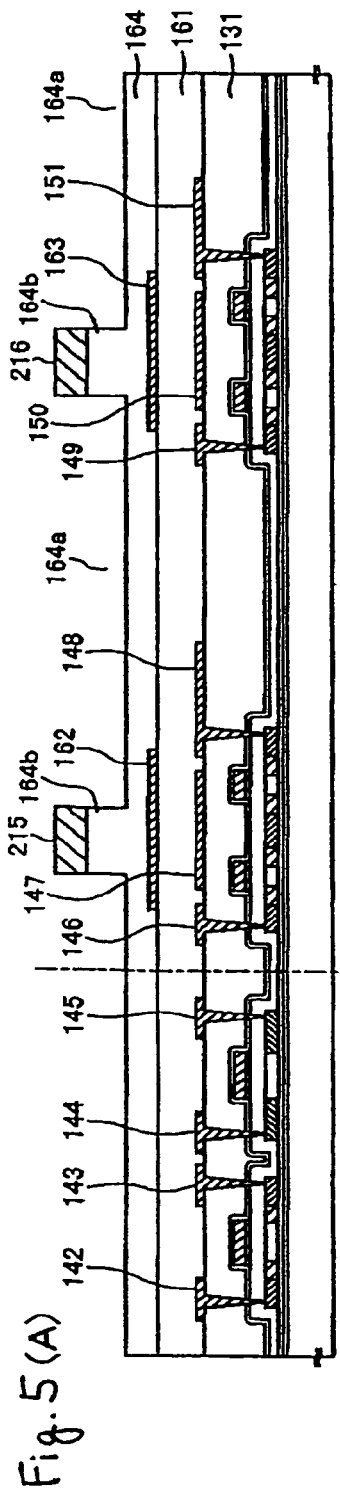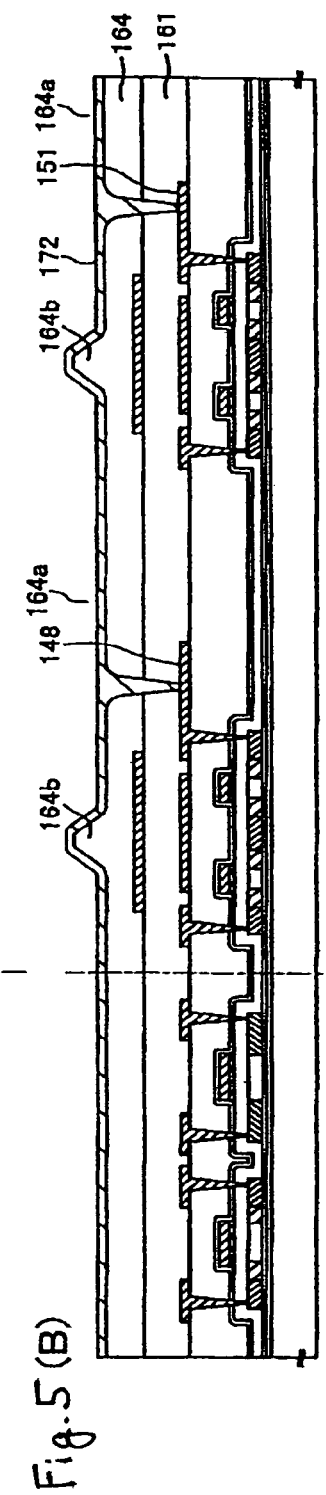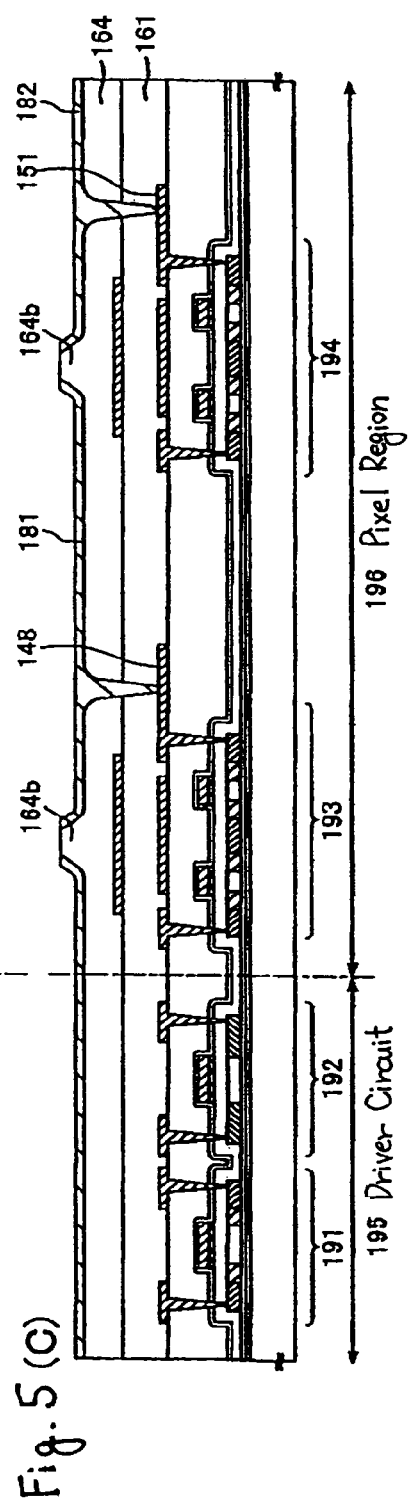

SEMICONDUCTOR DEVICE AND MANUFACTURING METHOD THEREOF

TECHNICAL FIELD

The present invention relates to a semiconductor device and a manufacturing method thereof; specifically, the invention relates to a technology for reducing distance between adjacent pixel electrodes to smaller than the limit set by conventional process margin and also preventing adjacent pixel electrodes from being short circuited.

BACKGROUND ART

A conventional active matrix liquid crystal display device has a plurality of TFTs (thin film transistor). A drain electrode is connected to a drain region of a TFT; a pixel electrode is connected to the drain electrode. A liquid crystal material is provided over the pixel electrode.
[Patent Document 1]
Japanese Patent Laid-Open No. 5-158068 (pp 2-3, FIG. 1)

DISCLOSURE OF THE INVENTION

Problem to be Solved by the Invention

In the above conventional active matrix liquid crystal display device, the liquid crystal material is driven by applying electric field to every pixel by a pixel electrode, and adjacent pixel electrodes are required to be insulated from each other. Thus, distance enough to insulate the adjacent pixel electrodes is required in between. However, since the liquid crystal material is not driven in the are between the adjacent pixel electrodes; therefore, the area is unnecessary in terms of driving the liquid crystal material. Accordingly, it is desirable that the distance between the adjacent pixel electrodes to be narrow as possible. If the distance can be reduced, the area of a light shielding film can also be reduced, which leads to improvements in the aperture ratio.

In the above active matrix liquid crystal display device, the distance between the adjacent pixel electrodes is mostly due to process margin; specifically, the followings are given.
1) The accuracy of controlling the size of a resist in a patterning process for forming a pixel electrode.
2) The accuracy of alignment in a patterning process for forming a pixel electrode.
3) The accuracy of controlling the difference in the size of a resist and the finished dimension.
4) The accuracy of an etching process in a patterning process (whether narrow space can be etched certainly).

The invention is made in view of the above circumstances. An object of the invention is to provide a technology for reducing distance between adjacent pixel electrodes to smaller than the limit set by conventional process margin and also preventing adjacent pixel electrodes from being short circuited

Means to Solve the Problems

The following two characteristic processes are employed in the invention to solve the above problems.
1) A projection is formed on the surface of an insulating film by processing the insulating film of a base for a pixel electrode. The projection is disposed between the adjacent pixel electrodes. The surface of the projection typically has a surface having curvature or an inclined surface.
2) A conductive film is formed over the entire surface of an insulating film having the projection, and the conductive film about the upper part or the top part of the projection is removed. With the process, a pixel electrode formed from the conductive film is formed over the insulating film, and the adjacent pixel electrodes are insulated by the projection. Note that, for example, removal by polishing by CMP (chemical mechanical polishing) is given as a method for removing the conductive film about the top part of the projection.

It is a feature of the invention that a manufacturing method of a semiconductor device according to the invention, includes: a step for processing a base insulating film of a pixel electrode, thereby forming a projection disposed between adjacent pixel electrode formation areas over the base insulating film; a step for forming a conductive film over the base insulating film; and a step for removing a conductive film about an upper part of the projection, thereby insulating the adjacent pixel electrodes by the projection as well as forming pixel electrodes formed with the conductive film over the base insulating film.

According to the above manufacturing method of a semiconductor device, a projection disposed between the adjacent pixel electrode formation areas is formed over the base insulating film by processing the base insulating film of the pixel electrodes; thus, the projection shall be an insulator for insulating the adjacent pixel electrodes. Consequently, distance between adjacent pixel electrodes can be reduced to smaller than the limit set by conventional process margin and also the adjacent pixel electrodes can be prevented from being short circuited.

Further, in a manufacturing method of a semiconductor device according to the invention, the step for forming the projection over the base insulating film can also be performed by processing the base insulating film of the pixel electrodes by wet etching or dry etching.

Further, in a manufacturing method of a semiconductor device according to the invention, the manufacturing method of a semiconductor device may further include steps for forming a thin film transistor over a substrate and for forming a base insulating film above the thin film transistor before the step for forming the projection over the base insulating film.

Further, in a manufacturing method of a semiconductor device according to the invention, the step for insulation by the projection can be performed by removing the conductive film about the upper part of the projection by CMP or by etchback.

Further, in a manufacturing method of a semiconductor device according to the invention, a surface of the projection may preferably be provided with a surface having curvature or an inclined surface.

It is a feature of the invention that a manufacturing method of a semiconductor device according to the invention, includes: a step for forming a thin film transistor over a substrate; a step for forming an insulating film above the thin film transistor; a step for forming a resist mask for covering an area between adjacent pixel electrode formation areas; a step for wet etching the insulating film using the resist mask as a mask, thereby forming a projection provided with a surface having curvature or an inclined surface, which is disposed between the adjacent pixel electrode over the insulating film; a step for forming a conductive film over the insulating film; and a step for polishing and removing a conductive film about an upper part of the projection by CMP, thereby insulating the adjacent pixel electrodes by the projection as well as forming pixel electrodes formed with the conductive film over the base insulating film.

According to the above manufacturing method of a semiconductor device, a projection provided with a surface having curvature or an inclined surface, which is disposed between the adjacent pixel electrode over the insulating film is formed by wet etching the insulating film using the resist mask as a mask. Since wet etching is isotropic etching, the interlayer insulating film is etched downward and inward under the resist mask, and the width of the projection can be made smaller than the width of the resist mask. Accordingly, an etching process more precise than the limit of the conventional resist processing can be performed; thus, the distance between the pixel electrodes can be reduced as well as short circuit between pixel electrodes can be certainly prevented.

It is a feature of the invention that a manufacturing method of a semiconductor device according to the invention, includes: a step for forming a thin film transistor over a substrate; a step for forming an insulating film above the thin film transistor; a step for forming a resist mask for covering an area between adjacent pixel electrode formation areas; a step for dry etching the insulating film using the resist mask as a mask in a first condition, thereby forming a projection provided with an almost vertical side surface, which is disposed between the adjacent pixel electrode formation areas over the insulating film; a step for dry etching the insulating film using the resist mask as a mask in a second condition, thereby forming a surface having curvature or an inclined surface on the projection provided with an almost vertical side surface; a step for forming a conductive film over the insulating film; and a step for polishing and removing a conductive film about an upper part of the projection by CMP, thereby insulating the adjacent pixel electrodes by the projection as well as forming pixel electrodes formed with the conductive film over the base insulating film.

According to the above manufacturing method of a semiconductor device, after the interlayer insulating film is dry-etched in the first condition using the resist mask as a mask thereby almost vertically processing the interlayer insulating film, the interlayer insulating film is dry etched in the second condition using the resist mask as a mask. Accordingly, the interlayer insulating film can be dry-etched while the resist mask is made to recede. Thus, the width of the projection is made smaller than the resist mask. Thus, the distance between the pixel electrodes can be reduced as well as short circuit between pixel electrodes can be certainly prevented.

In a manufacturing method of a semiconductor device according to the invention, it is preferable that a surface of the projection is provided with an inclined surface; an inclination angle of the inclined surface is 30° to 60°; and the height of the projection is at least 0.2 μm and at most 50% of a cell gap.

Further, in a manufacturing method of a semiconductor device according to the invention, the width of the projection is preferably at least 0.1 μm and at most 1.0 μm.

A semiconductor device of the invention may be one manufactured according to the above manufacturing method of a semiconductor device.

It is a feature of the invention that a semiconductor device according to the invention, includes adjacent pixel electrodes and a base insulating film of the pixel electrodes, which is a base insulating film having a projection for insulating the adjacent pixel electrodes, which is disposed between the adjacent pixel electrodes.

A semiconductor device according to the invention may further include a thin film transistor formed below a base insulating film, and the thin film transistor may be formed over a substrate.

Further, as to a semiconductor device according to the invention, a surface of the projection may preferably be provided with a surface having curvature or an inclined surface.

Further, as to a semiconductor device according to the invention, it is preferable that a surface of the projection is provided with an inclined surface; an inclination angle of the inclined surface is 30° to 60°; and the height of the projection is at least 0.2 μM and at most 50% of a cell gap.

Further, as to a semiconductor device according to the invention, the width of the projection is preferably at least 0.1 μm and at most 1.0 μm.

Effects of the Invention

Advantages offered by the invention are that distance between adjacent pixel electrodes is reduced to smaller than the limit set by conventional process margin and also that the adjacent pixel electrodes are prevented from being short circuited.

BEST MODE FOR CARRYING OUT THE INVENTION

Embodiment mode of the present invention will be described with reference to drawings.
(Embodiment Mode 1)

FIGS. 1A to 1D are cross-sectional views showing a manufacturing method of an active matrix liquid crystal display device, which is an example of a semiconductor device according to Embodiment Mode 1 of the invention.

First, as shown in FIG. 1A, a first and a second TFTs 11 and 12 are formed over a substrate 10 made of glass or quartz by a known method, for example, by a method disclosed in U.S. Pat. Nos. 3,300,153 and 2,873,669.

Subsequently, an interlayer insulating film 13 formed with an inorganic insulating film is formed on the first and the second TFTs 11 and 12 by a CVD (chemical vapor deposition) method. After this, a resist film is applied over the interlayer insulating film 13, and a resist mask 14 is formed over the interlayer insulating film 13 by exposing and developing the resist film. The resist mask 14 is a mask by which a portion to be in between a pixel electrode and a pixel electrode, namely, a mask in which the area where a pixel electrode is formed is opened. Further, a light shielding film 17 is disposed between the resist mask 14 and the first and the second TFTs 11 and 12.

Next, as shown in FIG. 1B, the interlayer insulating film 13 is wet-etched by using the resist mask 14 as a mask. Thus, a depression 13a is formed in the area in the interlayer insulating film 13, where a pixel electrode is formed, and a projection 13b is formed in the area to be in between a pixel electrode and a pixel electrode. Further, since wet etching is isotropic etching, the interlayer insulating film under the resist mask 14 (that is, the interlayer insulating film which is covered with the resist mask 14) is also partially etched. Consequently, the projection 13b is formed to have narrower width than the width of the resist mask 14, and a surface having curvature or an inclined surface is formed on a side surface of the projection 13b.

After this, as shown in FIG. 1C, the resist mask 14 is removed. Subsequently, contact holes 13c and 13d disposed over each drain electrode of the first and second TFTs 11 and 12 are formed in the interlayer insulating film 13. Further, a conductive film 15 is formed in the contact holes 13c and 13d and over the interlayer insulating film 13.

Next, as shown in FIG. 1D, a conductive film over the projection 13b of the interlayer insulating film is polished and removed by CMP. On this occasion, a part of the interlayer insulating film 13 may be removed. In this way, a first and a second pixel electrodes 15a and 15b are formed over the interlayer insulating film 13; a projection 13b is disposed between the first pixel electrode 15a and the second pixel electrode 15b; and the adjacent first and second pixel electrodes are insulated by the projection. The first pixel electrode 15a is electrically connected to the drain electrode of the first TFT 11, and the second pixel electrode 15b is electrically connected to the drain electrode of the second TFT 12.

The size and shape of the projection 13b of an interlayer insulating film shown in FIG. 1D are as follows. Electrode spacing x is preferably at least 0.1 μm and at most 1.0 μm. The lower limit of x is set at 0.1 μm to obtain the distance in which the adjacent pixel electrodes are not short-circuited, and the upper limit of x is set at 1.0 μm to obtain the distance in which aperture ratio can be increased.

Further, when the alignment of liquid crystal is controlled only by normal rubbing, a step (height of a projection) is preferably little. Accordingly, the height of a projection y is preferably 0.2 μm or below.

Further, the alignment of liquid crystal can be controlled without rubbing by precisely controlling the tapered shape formed in a projection. In this case, when the taper angle θ is 30° to 60°, the height of a projection y is preferably at least 0.2 μm and at most 50% of a cell gap, more preferably, at least 0.2 μm and at most 1.5 μm. Note that, the cell gap refers to distance between a pixel electrode and a counter substrate.

According to the above Embodiment Mode 1, the projection 13b is formed in the interlayer insulating film 13 by wet etching the interlayer insulating film 13 using the resist mask 14 as a mask; thus, the projection shall be an insulator for insulating the adjacent pixel electrodes. Consequently, distance between adjacent pixel electrodes is reduced to smaller than the limit set by conventional process margin and also the adjacent pixel electrodes are prevented from being short circuited.

Further, since wet etching is isotropic etching, the interlayer insulating film 13 is etched downward and inward under the resist mask, and the width (electrode spacing x) of the projection can be made smaller than the width of the resist mask 14. Accordingly, an etching process more precise than the limit of the conventional resist processing can be performed; thus, the distance between the pixel electrodes can be reduced as well as short circuit between pixel electrodes can be certainly prevented. Specifically, the electrode spacing x can be made at least 0.1 μm and at most 1.0 μm. Consequently, a liquid crystal material can be driven in a larger area, and improvement of aperture ratio can be attempted.

Further, since the area between the adjacent pixel electrodes is the projection 13b of the interlayer insulating film, the conductive film 15 is easily polished and removed by CMP.

Further, when the electrode polarity is reversed in a conventional active matrix liquid crystal display device, the contrast tends to be reduced by disclination due to lateral electric field. Correspondingly, in this embodiment mode, the interlayer insulating film between adjacent pixel electrodes is formed convexly; thus, longitudinal electric field becomes stronger than lateral electric field, and light leakage due to disclination can be controlled.

(Embodiment Mode 2)

FIGS. 2A to 2D show cross-sectional views of a manufacturing method of an active matrix liquid crystal display device, which is an example of a semiconductor device according to Embodiment Mode 2 of the invention, and similar parts are denoted by the same reference numerals in FIG. 1.

As shown in FIG. 2A, a first and a second TFTs 11 and 12 are formed over a substrate 10, and an interlayer insulating film 13 is formed over the first and the second TFTs 11 and 12 by the same method as Embodiment Mode 1.

After this, a resist film is applied over the interlayer insulating films 13, and a resist mask 16 is formed on the interlayer insulating film 13 by exposing and developing the resist film. The resist mask 16 is a mask by which a portion to be in between a pixel electrode and a pixel electrode, namely, a mask in which the area where a pixel electrode is formed is opened.

Next, the interlayer insulating film 13 is dry-etched by using the resist mask 16 as a mask in the first condition. Thus, a depression 23a is formed in the area in the interlayer insulating film 13, where a pixel electrode is formed, and a projection 23b is formed in the area to be in between a pixel electrode and a pixel electrode. The first condition is a condition in which the interlayer insulating film 13 is etched almost vertically.

Next, as shown in FIG. 2B, the interlayer insulating film 13 is dry-etched in the second condition using the resist mask 16 as a mask. The second condition is a condition in which a surface having curvature or an inclined surface is formed on a side surface of the projection 23b by dry-etching the interlayer insulating film 13 while the resist mask 16 is made to recede. Thus, the width of the projection 23b is made to be smaller than the resist mask 16 before dry etching, and a surface having curvature or an inclined surface is formed on a side surface of the projection 23b.

After this, as shown in FIG. 2C, the resist mask 16 is removed. Subsequently, contact holes 13c and 13d disposed over each drain electrode of the first and second TFTs 11 and 12 are formed in the interlayer insulating film 13. Further, a conductive film 15 is formed in the contact holes 13c and 13d and over the interlayer insulating film 13.

Next, as shown, in FIG. 2D, a conductive film over the projection 23b of the interlayer insulating film is polished and removed by CMP as in the case of Embodiment Mode 1. On this occasion, a part of the interlayer insulating film 13 may be removed. In this way, a first and a second pixel electrodes 15a and 15b are formed over the interlayer insulating film 13; the projection 23b is disposed between the first pixel electrode 15a and the second pixel electrode 15b; and the adjacent first and second pixel electrodes are insulated by the projection. Note that, the size and shape of the projection 23b of an interlayer insulating film, that is, the electrode spacing x and the height of the projection, shown in FIG. 2D shall be the same as in Embodiment Mode 1.

Similar effects to Embodiment Mode 1 can be obtained in the above Embodiment Mode 2. That is, in Embodiment Mode 2, after the interlayer insulating film 13 is dry-etched in the first condition using the resist mask 16 as a mask thereby almost vertically processing the interlayer insulating film 13, the interlayer insulating film 13 is dry etched in the second condition using the resist mask 16 as a mask. Accordingly, the interlayer insulating film can be dry-etched while the resist mask 16 is made to recede. Thus, the width of the projection 23b (electrode spacing x) is made smaller than the resist mask 16 before etching. Thus, the distance between the pixel electrodes can be reduced as well as short circuit between pixel electrodes can be certainly prevented. Consequently, a liquid crystal material can be driven in a larger area, and improvement of aperture ratio can be attempted. Further, the following two fabrication methods may be used for a method for fabricating the projection 23b or the like. One is a method in which after the cross-sectional shape of a resist is tapered in the first etching condition, an interlayer insulating film is etched in the second etching condition while the resist is made to recede. The other is a method in which a resist mask with tapered shape is formed from the beginning, and an interlayer insulating film is etched while the resist mask is made to recede.

Further, since the area between the adjacent pixel electrodes is the projection 23b of the interlayer insulating film, the conductive film 15 is easily polished and removed by CMP.

Further, when the electrode polarity is reversed in a conventional active matrix liquid crystal display device, the contrast tends to be reduced by disclination due to lateral electric field. Correspondingly, in this embodiment mode, an interlayer insulating film between adjacent pixel electrodes is formed convexly; thus, longitudinal electric field becomes stronger than lateral electric field, and light leakage due to disclination can be controlled.

Note that, various modifications may be made without limitation to the embodiment modes in implementing the invention. Further, in Embodiment Mode 1 and Embodiment Mode 2, a conductive film over a projection of an interlayer insulating film is polished and removed by CMP; however, the conductive film can be removed by a method other than CMP. For example, an etchback method in which a conductive film is formed over a projection of an interlayer insulating film; an application film (such as a resist film) is formed; a coating film and a conductive film are etched, thereby removing the conductive film over the projection of the interlayer insulating film may be used.

Further, the invention is described by using an active matrix liquid crystal display device in Embodiment Mode 1 and Embodiment Mode 2; however, the invention can be applied to other display devices, for example, an organic EL, an inorganic EL, or the like.

(Embodiment 1)

FIGS. 3A to 3C and FIGS. 4A to 4C are cross-sectional views showing a manufacturing method of an active matrix substrate according to Embodiment 1 of the invention.

First, as shown in FIG. 3A, a substrate 100 such as a glass substrate or a quartz substrate is provided, and a base insulating film 101 formed with an inorganic insulating film is formed over the substrate 100 to a thickness of 10 nm to 200 nm by a known method. The base insulating films 101 in which a silicon oxynitride film 101a formed of $SiH_4$, $NH_3$, and $N_2O$ is formed to a film thickness of 50 nm over the substrate 100, and a silicon oxynitride film 101a formed of $SiH_4$ and $N_2O$ is formed to a film thickness of 100 nm over the silicon oxynitride film 101b. The base insulating film 101 is formed as a barrier film to prevent alkali metal contained in a glass substrate from diffusing into a semiconductor layer, so that a process for forming a base insulating film may be omitted in the case of using a quartz substrate.

Next, a crystalline semiconductor film is formed over the base insulating film 101 by a known method. Specifically, after an amorphous silicon film is formed by plasma CVD, low pressure CVD, or sputtering over the base insulating film 101, a solution including a metal element, for example, a nickel acetate salt solution including nickel of 1 ppm to 10 ppm in terms of weight, is applied by spin coating using a spinner for forming a catalyst element including layer. Note that, a solution including nickel is used here; however, a solution including other metal can also be used. As other metal element, one or more selected from the group consisting of such as iron, cobalt, ruthenium, palladium, osmium, iridium, platinum, copper, and gold can be used. Subsequently, hydrogen contained in the amorphous silicon film is released by heat-treating the substrate at a temperature of 500° C., for example, for a heating time of one hour. Next, a crystalline silicon film is formed over the base insulating film 101 by heating the substrate at a temperature of from 500° C. to 650° C. for a heating time of one hour to 24 hours (for example, at 500° C. for a heating time of four hours). A heating method in the case may be laser irradiation.

Thereafter, a metal element in a crystalline silicon film is removed or the concentration is reduced by gettering. As a technique of gettering a method in which a gettering site is formed by doping phosphorus, rare gas (generally, argon), or the like into a part of the crystalline silicon film and is heat-treated thereafter, so that a metal element is segregated; or another method in which an amorphous silicon film or a crystalline silicon film each including phosphorus, rare gas, or the like is stacked over an oxide film so as to form a gettering site, so that a catalyst element is moved to the gettering site after heat treatment. It is preferable that the metal impurity concentration in the crystalline silicon film after gettering be $1 \times 10^{17}/cm^3$ or less (SIMS (secondary ion mass spectrometry) measurement limit or less), and more preferably, $5 \times 10^{16}/cm^3$ or less when measured by ICP-MS (inductively coupled plasma mass spectrometry).

Next, active layers 103 to 106 formed with a crystalline silicon film are formed over the base insulating film 101 by etching the crystalline silicon film to a desired shape. Subsequently, a gate insulating film 107 is formed over the active layers 103 to 106 and the base insulating film 101 by plasma CVD or sputtering. After this, impurity giving n-type conductivity is selectively added to a region other than a channel region of the semiconductor film (a region 104 shown in FIG. 3A) which is to be a p-channel TFT. Subsequently, an about 30 nm-thick first conductive film 108 formed with a tantalum nitride film is formed over the gate insulating film 107. Further, an about 370 nm-thick second conductive film 109 formed with a tungsten film is formed over the first conductive film 108.

Further, a tantalum nitride film is used for the first conductive film 610, and a tungsten film is used for the second conductive film 109 here; however, without limitation to this, a film formed with an element selected from the group consisting of tantalum (Ta), tungsten (W), titanium (Ti), molybdenum (Mo), aluminum (Al), copper (Cu), chrome (Cr), and neodymium (Nd), alloy material or a compound at least including one or more of the above elements as its main components, or a silver-copper-palladium alloy (Ag—Pd—Cu alloy) film may be used for each of the first and the second conductive films 108 and 109.

After this, an active matrix substrate is made by using a known method as shown in Embodiment 1 of Japanese Patent Laid-Open No. 2000-243975. Specifically, as shown in FIG. 3B, a first gate electrode formed with a first and a second conductive films 121a and 121b, a second gate electrode formed with a first and a second conductive films 122a and 122b, a third gate electrode formed with a first and a second conductive films 123a and 123b, a fourth gate electrode formed with a first and a second conductive films 124a and 124b are formed over the gate insulating film 107 by patterning the first and the second conductive films 108 and 109. Incidentally, a gate electrode is formed with the first the second conductive films here; however, a layer of a conductive film formed from such as tantalum (Ta), tungsten (W), titanium (Ti), conductive films, or molybdenum (Mo).

Subsequently, impurity elements of groups III and V are respectively doped to an n-TFT and a P-TTT. Low concentration impurity regions 121 to 123 and source region or drain regions 124 to 126 are formed in an active layer of the n-TFT, and a source or drain region 127 is formed in an active layer of the p-TFT. Subsequently, a first interlayer insulating film 130 which is an inorganic insulating film which is an inorganic insulating film formed with a silicon nitride film to a film thickness of about 50 nm or the like by plasma CVD over the entire surface including the gate electrode. Further, after impurity elements of groups III and V are doped, the impurity element is activated by heat treatment or laser annealling as necessary.

Next, as shown in FIG. 3C, a second interlayer insulating film 131 which is an inorganic insulating film formed with a silicon oxide film with a film thickness of about 530 nm or the like formed by plasma CVD is formed over the first interlayer insulating film 130. Subsequently, a contact hole is formed in the first and the second interlayer insulating films 130 and 131 and over the gate insulating film 107. Further, a conductive film in which a titanium film and an aluminum film are stacked is formed in the contact hole and over the interlayer insulating film 131. Wirings 142 to 151 are formed on the second interlayer insulating film 131 by etching the conductive film into the desired shape.

Thereafter, as shown in FIG. 4A, a third interlayer insulating film 161 formed with an inorganic insulating films such as a silicon oxide film with a film thickness of about 100 nm is formed by plasma CVD on the entire surface including the wirings 142 to 151. Note that, it is desirable to planarize the third interlayer insulating film. For example, a method by flow, a method by CMP, a method by bias sputtering, a method by etchback, a method by CMP after flow, and the like are given as methods for the planarization. Subsequently, a fourth conductive film formed of Al with a film thickness of about 100 nm is formed over the third interlayer insulating film 161. Black matrices 162 and 163 formed with the fourth conductive film is formed over the third interlayer insulating film 161 by patterning the fourth conductive film.

Subsequently, a fourth interlayer insulating film 164 formed with a silicon oxide film or the like is formed over the entire surface including the black matrices 162 and 163 to a film thickness of about 600 nm to 1000 nm by plasma CVD. Subsequently, a resist film is applied to the fourth interlayer insulating film 164, and the resist film is exposed and developed, thereby forming resist masks 165 and 166 over the fourth interlayer insulating film 164.

Next, as shown in FIG. 4B, the fourth interlayer insulating film 164 is wet-etched using the resist masks 165 and 166 as masks. The etching condition at that time is that the fourth interlayer insulating film is wet-etched by immersing substrate into a solution of 1/100 HF and ammonium fluoride at a temperature of from 18° C. to 25° C. for several minutes. In this way, a depression 164a is formed in a region on the fourth interlayer insulating film 164, where a pixel electrode is formed, and a projection 164b is formed in between a pixel electrode and a pixel electrode. Further, since wet etching is isotropic etching, the interlayer insulating film under resist masks 165 and 166 (that is, the fourth interlayer insulating film which is covered with the resist masks 165 and 166) is also partially etched. Consequently, the projection 164b is formed to have a narrower width than the width of the resist masks 165 and 166, and a surface having curvature or an inclined surface is formed on a side surface of the projection 164b.

Subsequently, the resist masks 165 and 166 are removed. Further, contact holes disposed on the wirings 148 and 151 are formed over the third and the fourth interlayer insulating films 161 and 164. Subsequently, a fifth conductive film 172 formed of ITO with a film thickness of about 100 nm is formed in the contact holes and over the fourth interlayer insulating film 164.

Further, for the fifth conductive film 172, a metal film with high light reflectance typified by a material film including aluminum or silver as a main component is preferably used in the case of a reflective liquid crystal display device, and a light-transmitting conductive film typified by ITO (indium oxide tin oxide alloy), indium oxide zinc oxide alloy ($In_2O_3$—ZnO), or zinc oxide (ZnO), or the like, or a layered film thereof is preferably used in the case of a transmissive liquid crystal display device.

After this, as shown in FIG. 4C, the fifth conductive film 172 over the projection 164b of the fourth interlayer insulating film is polished and removed by CMP. On this occasion, a part of the fourth interlayer insulating film 164 may be removed. In this way, a first and a second pixel electrodes 181 and 182 are formed over the fourth interlayer insulating film 164; the projection 164b is disposed between the first pixel electrode 181 and the second pixel electrode 182; and the adjacent first and the second pixel electrodes are insulated by the projection. The first pixel electrode 181 is electrically connected to the wiring 148, and the second pixel electrode 182 is electrically connected to the wiring 151. With the above steps, an active matrix substrate in which a driver circuit 195 including an n-channel TFT 191 and a p-channel TFT 192, and a pixel region 196 including pixel TFTs 193 and 194 are provided over one substrate can be made.

The size and shape of the projection 164b of the fourth interlayer insulating film shown in FIG. 4C shall be the same as in Embodiment Mode 1.

According to the above Embodiment 1, the projection 164b is formed in the fourth interlayer insulating film 164 by wet etching the fourth interlayer insulating film 164 using the resist masks 165 and 166 as masks; thus, the projection shall be an insulator for insulating the adjacent pixel electrodes. Consequently, distance between adjacent pixel electrodes is reduced to smaller than the limit set by conventional process margin and also the adjacent pixel electrodes are prevented from being short circuited.

Further, since wet etching is isotropic etching, the fourth interlayer insulating film 164 is etched downward and inward under the resist mask, and the width (electrode spacing) of the projection can be made smaller than the width of the resist masks 165, 166. Accordingly, an etching process more precise than the limit of the conventional resist processing can be performed; thus, the distance between the pixel electrodes can be reduced as well as short circuit between pixel electrodes can be certainly prevented. Specifically, the electrode spacing can be made at least 0.1 µm and at most 1.0 µm. Consequently, a liquid crystal material can be driven in a larger area, and improvement of aperture ratio can be attempted.

Further, since the area between the adjacent pixel electrodes is the projection 164b of the fourth interlayer insulating film, the fifth conductive film 172 is easily removed by CMU.

Further, when the electrode polarity is reversed in a conventional active matrix liquid crystal display device, the contrast tends to be reduced by disclination due to lateral electric field. Correspondingly, in this embodiment, the fourth interlayer insulating film between adjacent pixel electrodes is formed convexly; thus, longitudinal electric field becomes stronger than lateral electric field, and light leakage due to disclination can be controlled.

In addition, in the above Embodiment 1, the fifth conductive film 172 formed of ITO is formed in the contact hole and over the fourth interlayer insulating film 164, and the fifth conductive film 172 over the projection 164b of the fourth interlayer insulating film is polished and removed by CMP. However, a first ITO may be formed into a film in the contact hole and over the fourth interlayer insulating film 164; the first ITO may be baked; a second ITO may be formed into a film over the first ITO; and the first and the second ITO over the projection 164b of the fourth interlayer insulating film may be polished and removed by CMP. In this case, the first and the second ITO are equivalent to the fifth conductive film 172, the first ITO is a conductive film to be a pixel electrode, and the second ITO is a conductive film to protect the first ITO in polishing by CMP. Further, after a pixel electrode is formed by polishing by CMP, the second ITO is removed.

(Embodiment 2)

FIGS. 5A to 5C are cross-sectional views showing a manufacturing method of an active matrix substrate according to Embodiment 2 of the invention, and similar parts to FIG. 3 and FIG. 4 are denoted by the same reference numerals.

First, steps similar to the steps according to Embodiment 1 shown in FIGS. 3A to 3C are performed. Subsequently, as shown in FIG. 5A, a third interlayer insulating film 161 formed with an inorganic insulating film such as a silicon oxide film to a film thickness of about 100 nm is formed over the entire surface including the wirings 142 to 151 by plasma CVD. Subsequently, a fourth conductive film formed of Al with a film thickness of about 100 nm is formed over the third interlayer insulating film 161. Black matrices 162 and 163 formed with the fourth conductive film are formed over the third interlayer insulating film 161 by patterning the fourth conductive film.

Subsequently, a fourth interlayer insulating film 164 formed with a silicon oxide film or the like is formed to a film thickness of about 600 nm to 1000 nm over the entire surface including the black matrices 162 and 163 by plasma CVD. Subsequently, a resist film is applied over the fourth interlayer insulating film 164, and the resist film is exposed and developed, thereby forming resist masks 215 and 216 over the fourth interlayer insulating film 164. The resist masks 215 and 216 are masks by which a portion to be in between a pixel electrode and a pixel electrode, namely, masks in which the area where a pixel electrode is formed is opened.

Next, the fourth interlayer insulating film 164 is dry-etched in the first condition using the resist masks 215 and 216 as masks. Thus, a depression 164a is formed in an area on the fourth interlayer insulating film 164, where a pixel electrode is formed, and a projection 164b is formed in between a pixel electrode and a pixel electrode. Note that the first condition is a condition in which the fourth interlayer insulating film 164 is etched almost vertically.

Next, the fourth interlayer insulating film 164 is dry-etched in the second condition using the resist masks 215 and 216 as masks. The second condition is a condition in which carbon fluoride ($CF_4$) and oxygen ($O_2$) with a gas flow ratio of 70/30 (sccm) are used for an etching gas, and a surface having curvature or an inclined surface is formed on a side surface of the projection 164b by dry-etching the fourth interlayer insulating film 164 while the resist masks 215 and 216 are made to recede. Thus, the width of the projection 164b is made to be smaller than the resist masks 215 and 216 before dry etching, and a surface having curvature or an inclined surface is formed on a side surface of the projection 164b.

Subsequently, the resist masks 215 and 216 are removed. Further, contact holes disposed on the wirings 148 and 151 are formed over the third and the fourth interlayer insulating films 161 and 164. Subsequently, a fifth conductive film 172 formed of ITO to a film thickness of about 100 nm is formed in the contact holes and over the fourth interlayer insulating film 164. Incidentally, the material for the fifth conductive film 172 is the same as in Embodiment 1

After this, as shown in FIG. 5C, the fifth conductive film 172 over the projection 164b of the fourth interlayer insulating film is polished and removed by CMP. On this occasion, a part of the fourth interlayer insulating film 164 may be removed. In this way, a first and a second pixel electrodes 181 and 182 are formed over the fourth interlayer insulating film 164; the projection 164b is disposed between the first pixel electrode 181 and the second pixel electrode 182; and the adjacent first and the second pixel electrodes are insulated by the projection. With the above steps, an active matrix substrate in which a driver circuit 195 including an n-channel TFT 191 and a p-channel TFT 192, and a pixel region 196 including pixel TFTs 193 and 194 are provided over one substrate can be made.

The size and shape of the projection 164b of the fourth interlayer insulating film shown in FIG. 4C shall be the same as in Embodiment Mode 1.

Similar effects to Embodiment 1 can be obtained in the above Embodiment 2. That is, in Embodiment 2, after the fourth interlayer insulating film 164 is dry-etched in the first condition using the resist masks 215 and 216 as masks thereby almost vertically processing the interlayer insulating film, the fourth interlayer insulating film is dry etched in the second condition using the resist masks as masks. Accordingly, the fourth interlayer insulating film can be dry-etched while the resist masks is made to recede. Thus, the width of the projection 164b (electrode spacing) is made smaller than the resist masks before etching. Thus, the distance between the pixel electrodes can be reduced as well as short circuit between pixel electrodes can be certainly prevented. Consequently, a liquid crystal material can be driven in a larger area, and improvement of aperture ratio can be attempted.

Further, since the area between the adjacent pixel electrodes is the projection 164b of the interlayer insulating film, the conductive film 172 is easily removed by CMP.

Further, when the electrode polarity is reversed in a conventional active matrix liquid crystal display device, the contrast tends to be reduced by disclination due to lateral electric field. Correspondingly, in this embodiment mode, the interlayer insulating film between adjacent pixel electrodes is formed convexly; thus, longitudinal electric field becomes stronger than lateral electric field, and light leakage due to disclination can be controlled.

(Embodiment 3)

FIG. 6 shows a cross-sectional view of a manufacturing method of an active matrix liquid crystal display device (a liquid crystal display panel) according to Embodiment 3 of the invention. In this embodiment, a manufacturing method of an active matrix liquid crystal display device from an active matrix substrate fabricated in Embodiment 1 or Embodiment 2 will be described below with reference to FIG. 6.

First, in accordance with Embodiment 1 or Embodiment 2, after an active matrix substrate is obtained as in FIG. 4C or FIG. 5C, an alignment film 811 is formed over the active matrix substrate and rubbing is performed. Note that, in this embodiment, a column spacer for keeping a distance between substrates is formed in a desirable position by patterning an organic resin film such as an acrylic resin film before forming the alignment film. Further, spherical spacers may be dispersed all over the substrate instead of a column spacer.

Next, a counter substrate 801 is prepared. The counter substrate is provided with a color filter 802 in which a colored layer and a light shielding layer are disposed correspondingly to each pixel. Further, a light shielding layer is provided over the part of a driver circuit. A planarization film 807 covering the color filter and the light shielding layers is provided. Subsequently, a counter electrode 808 formed with a transparent conductive film is formed over the planarization film over the pixel region. An alignment film 812 is formed over the entire surface of the counter substrate, and then rubbing is performed.

Subsequently, the active matrix substrate over which the pixel region and the driver circuit are formed, and the counter substrate are pasted together with a sealing member 809. The sealing member is added with fillers, and the two substrates are pasted together with a uniform distance therebetween created by the fillers and the column spacer. Thereafter, the gap between the both substrates is filled with a liquid crystal material 810, and completely sealed with sealant (not shown). A known material may be used for the liquid crystal material. Thus, an active matrix liquid crystal display device can be finished. Note that, if necessary, the active matrix substrate or the counter substrate is cut into a desirable shape. Further, a polarizing plate 803 and the like are provided fittingly using a known technology. An FPC (not shown) is further pasted to the substrate using a known technology.

Next, an active matrix liquid crystal display device is completed by providing a backlight 804 and an optical waveguide 805, and by covering the liquid crystal module with a cover 806. Note that, the cover 806 and the liquid crystal module are pasted together with an adhesive or an organic resin. The polarizing plate 803 is pasted to each of the active matrix substrate and the counter substrate, since the liquid crystal display device is transmissive type.

Note that, various modifications can be made in the range not departing from the purpose of the invention without limitation to the above embodiment in implementing the invention. For example, the invention can be applied to a substrate other than an LCD substrate; further, the invention can be applied to an electro-optic device or a semiconductor device except a liquid crystal display device.

A liquid crystal display device described in the above embodiments can be used for a display of various electronic devices. Note that the electronic devices here are defined as products equipped with liquid crystal display devices. As such electronic devices, a video camera, a still camera, a projector, a projection TV, a head mounted display, a car navigation system, a personal computer (including a laptop), a portable information terminal (such as a mobile computer or a cellular phone), or the like can be given.

BRIEF DESCRIPTION OF THE DRAWINGS

[FIG. 1]
A to D are cross-sectional views showing a manufacturing method of an active matrix liquid crystal display device which is an example of a semiconductor device according to Embodiment Mode 1 of the invention.

[FIG. 3]
A to C are cross-sectional views showing a manufacturing method of an active matrix substrate according to Embodiment 1 of the invention.

[FIG. 4]
A to C are cross-sectional views showing a step after FIG. 3C in a manufacturing method of an active matrix substrate according to Embodiment 1 of the invention.

[FIG. 5]
A to C are cross-sectional views showing a manufacturing method of an active matrix substrate according to Embodiment 2 of the invention.

Figure 2A:
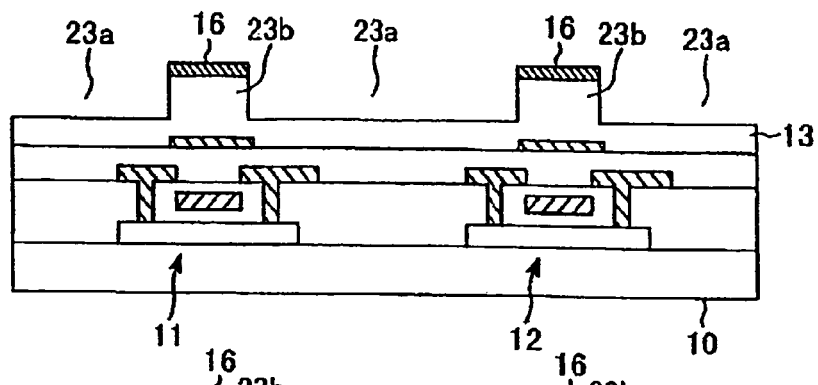
[FIG. 2]
A to D are cross-sectional views showing a manufacturing method of an active matrix liquid crystal display device which is an example of a semiconductor device according to Embodiment Mode 2 of the invention.
Figure 2B:
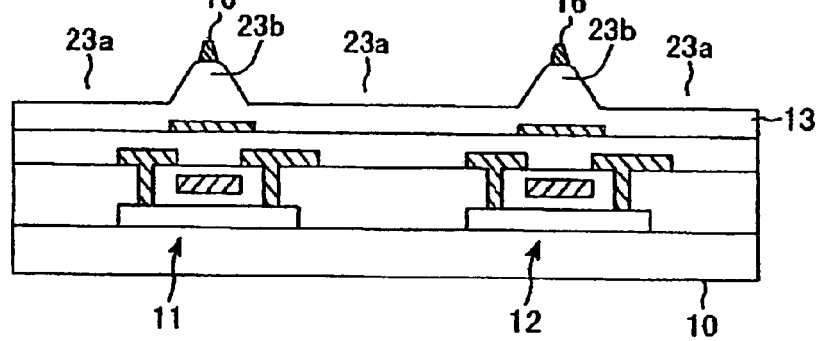
Figure 2C:
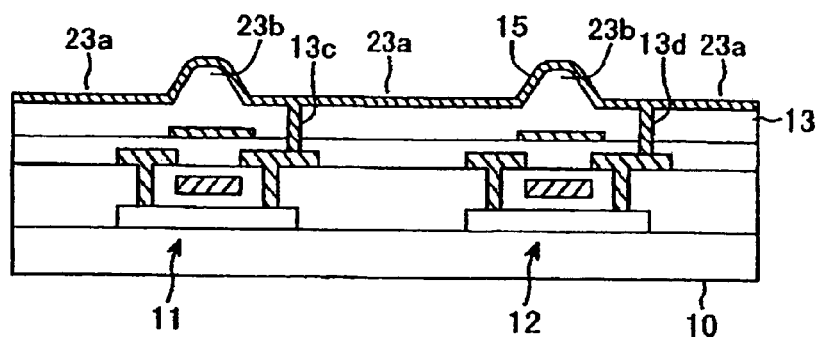
Figure 2D:
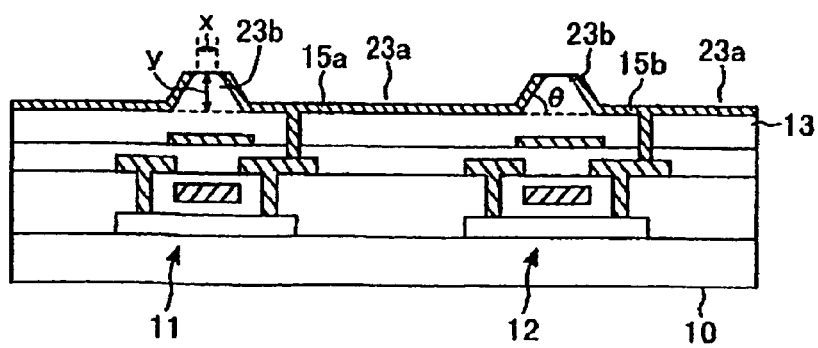
Figure 6:
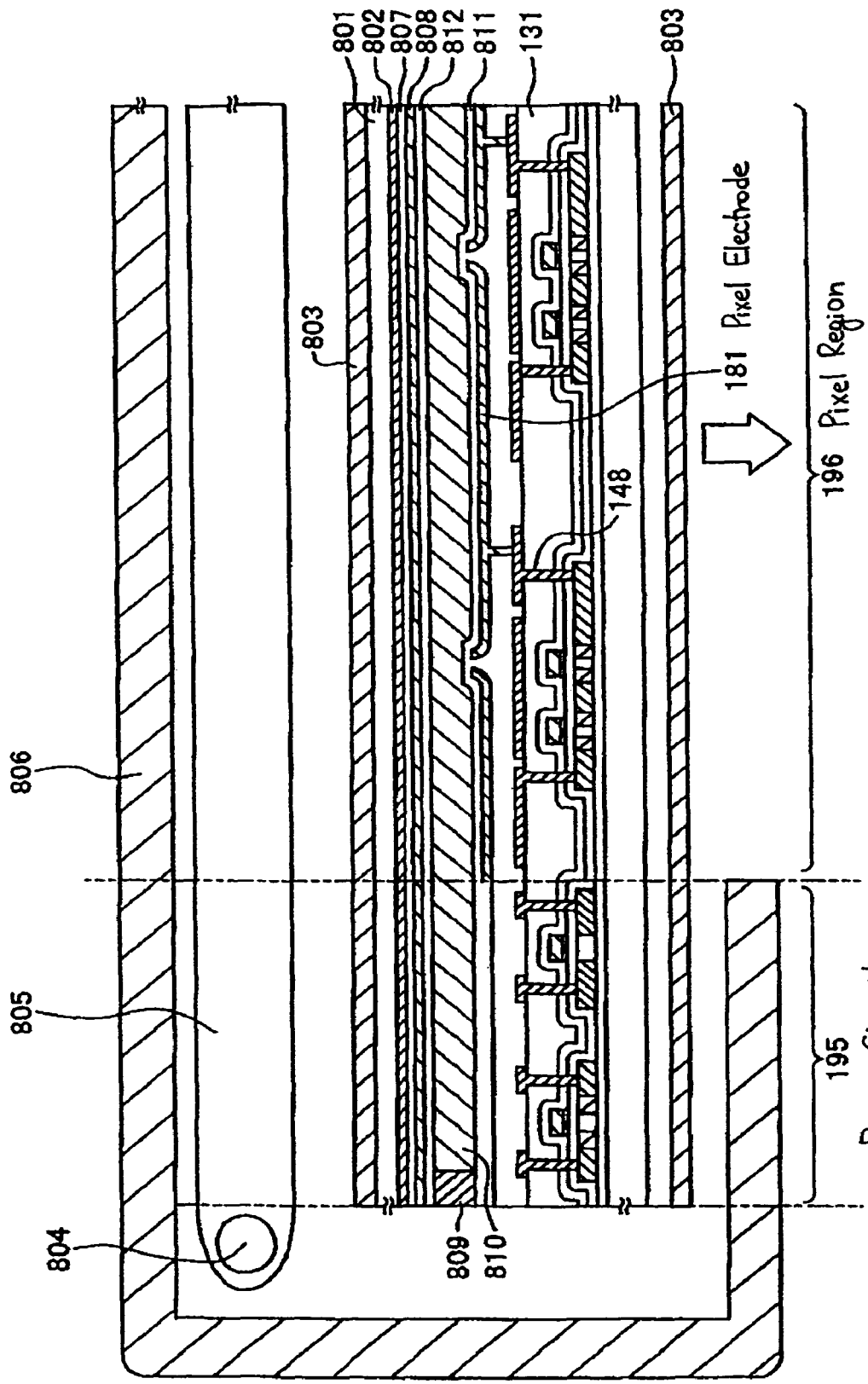
[FIG. 6]
A cross-sectional view showing a manufacturing method of an active matrix substrate according to Embodiment 3 of the invention.

[Explanation of Reference Numerals]
10, 100: substrates
11: a first TFT
12: a second TFT
13: an interlayer insulating film
13*a*, 23*a*: depressions
13*b*, 23*b*: projections
13*c*, 13*d*: contact holes
14, 16: resist masks
15: a conductive film
15*a*, 15*b*: first and second pixel electrodes
17: a light shielding film
101: a base insulating film
101*a*, 101*b*: silicon oxynitride films
103-106: active layers
107: a gate insulating film
108, 121*a*, 122*a*, 123*a*, 124*a*: first conductive films
109, 121*b*, 122*b*, 123*b*, 124*b*: second conductive films
121-123: low concentration impurity regions
124-127: a source region or a drain region
130: a first interlayer insulating film
131: a second interlayer insulating film
142-151: wirings
161: a third interlayer insulating film
162, 163: black matrices
164: a fourth interlayer insulating film
164*a*: a depression
164*b*: a projection
165, 166, 215, 216: resist masks
172: a fifth conductive film
181: a first pixel electrode
182: a second pixel electrode
191: an n-channel TFT
192: a p-channel TFT
193, 194: pixel TFTs
195: a driver circuit
196: a pixel region
801: a counter substrate
802: a color filter
803: polarizing plate
804: a backlight
805: an optical waveguide
806: a cover
807: a planarizing film
808: a counter electrode
809: a sealing member
810: a liquid crystal material
811, 812: alignment films

What is claimed is:
1. A display device comprising:
a thin film transistor over a glass substrate;
an insulating film having a first region and a second region over the thin film transistor; and
at least a first pixel electrode of a first pixel and a second pixel electrode of a second pixel over the second region, wherein the second pixel is adjacent to the first pixel,
wherein the first region is disposed between the first pixel electrode and the second pixel electrode,
wherein the first region has a tapered side surface, and wherein a first thickness of the first region is thicker than a second thickness of the second region.

2. The display device according to claim 1, wherein a width of the first region is at least 0.1 µm and at most 1.0 µm.

3. The display device according to claim 1, wherein the display device is one selected from the group consisting of a liquid crystal display device, an organic EL display device, and an inorganic EL display device.

4. The display device according to claim 1, wherein the tapered side surface has curvature.

5. The display device according to claim 1, wherein the highest portion of the first region and the highest portion of the first pixel electrode and the second pixel electrode are same in height.

6. The display device according to claim 1, wherein one of the first pixel electrode and the second pixel electrode is electrically connected to the thin film transistor.

7. The display device according to claim 1, wherein a thickness of the first pixel electrode and a thickness of the second pixel electrode are smaller than a height of the first region.

8. A display device comprising:
a thin film transistor over a glass substrate;
an insulating film having a first region and a second region over the thin film transistor; and
at least two pixel electrodes, which are adjacent to each other, over the second region,
wherein the first region is disposed between the pixel electrodes,
wherein the first region has a tapered side surface,
wherein an angle of the tapered side surface is 30° to 60°, and
wherein a first thickness of the first region is thicker than a second thickness of the second region.

9. The display device according to claim 8, wherein a width of the first region is at least 0.1 µm and at most 1.0 µm.

10. The display device according to claim 8, wherein the display device is one selected from the group consisting of a liquid crystal display device, an organic EL display device, and an inorganic EL display device.

11. The display device according to claim 8, wherein the tapered side surface has curvature.

12. The display device according to claim 8, wherein the highest portion of the first region and the highest portion of the pixel electrodes are same in height.

13. The display device according to claim 8, wherein one of the pixel electrodes is electrically connected to the thin film transistor.

14. The display device according to claim 8, wherein each thickness of the pixel electrodes is smaller than a height of the first region.

15. A display device comprising:
a thin film transistor over a glass substrate;
an insulating film having a projection over the thin film transistor; and
at least two pixel electrodes over the insulating film,
wherein the projection is disposed between adjacent pixel electrodes,
wherein the projection has a tapered side surface, and
wherein a height of the projection is at least 0.2 µm and at most 50% of a cell gap between one of the pixel electrodes and a counter substrate.

16. The display device according to claim 15, wherein a width of the projection is at least 0.1 µm and at most 1.0 µm.

17. The display device according to claim 15, wherein each thickness of the pixel electrodes is smaller than the height of the projection.

18. The display device according to claim 15, wherein the display device is one selected from the group consisting of a liquid crystal display device, an organic EL display device, and an inorganic EL display device.

19. The display device according to claim 15, wherein the tapered side surface has curvature.

20. The display device according to claim 15, wherein the highest portion of the projection and the highest portion of the pixel electrodes are same in height.

21. The display device according to claim 15, wherein one of the pixel electrodes is electrically connected to the thin film transistor.

22. A display device comprising:
a thin film transistor over a glass substrate;
an insulating film having a first region and a second region over the thin film transistor; and
at least two pixel electrodes over the second region,
wherein the first region is disposed between adjacent pixel electrodes,
wherein the first region has a tapered side surface,
wherein at least a part of the first region is not covered by the pixel electrodes,
wherein at least one of the pixel electrodes is bended along a surface of the second region and the tapered side surface of the first region, and
wherein a first thickness of the first region is thicker than a second thickness of the second region.

23. The display device according to claim 22, wherein a width of the first region is at least 0.1 µm and at most 1.0 µm.

24. The display device according to claim 22, wherein the display device is one selected from the group consisting of a liquid crystal display device, an organic EL display device, and an inorganic EL display device.

25. The display device according to claim 22, wherein the tapered side surface has curvature.

26. The display device according to claim 22, wherein the highest portion of the first region and the highest portion of the pixel electrodes are same in height.

27. The display device according to claim 22, wherein one of the pixel electrodes is electrically connected to the thin film transistor.

28. The display device according to claim 22, wherein each thickness of the pixel electrodes is smaller than a height of the first region.

* * * * *